United States Patent
Takeuchi et al.

(10) Patent No.: US 9,111,809 B2
(45) Date of Patent: Aug. 18, 2015

(54) CIRCUIT SUBSTRATE, METHOD FOR MANUFACTURING THE SAME, AND ELECTROOPTICAL DEVICE

(71) Applicant: Japan Display Inc., Tokyo (JP)

(72) Inventors: Shunpei Takeuchi, Tottori (JP); Akio Ota, Tottori (JP); Manabu Mizuno, Tottori (JP); Takaya Hirose, Tottori (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 13/748,109

(22) Filed: Jan. 23, 2013

(65) Prior Publication Data

US 2013/0200401 A1 Aug. 8, 2013

(30) Foreign Application Priority Data

Feb. 8, 2012 (JP) .................................. 2012-024894

(51) Int. Cl.
- *H01L 27/12* (2006.01)
- *H01L 27/146* (2006.01)
- *H01L 27/15* (2006.01)
- *H01L 21/768* (2006.01)
- *H01L 27/32* (2006.01)

(52) U.S. Cl.
CPC ...... *H01L 27/1248* (2013.01); *H01L 21/76835* (2013.01); *H01L 27/124* (2013.01); *H01L 27/1214* (2013.10); *H01L 27/14603* (2013.01); *H01L 27/15* (2013.01); *H01L 27/3248* (2013.01); *H01L 21/76804* (2013.01)

(58) Field of Classification Search
None
See application file for complete search history.

(56) References Cited

U.S. PATENT DOCUMENTS

| | | | |
|---|---|---|---|
| 2009/0141229 A1* | 6/2009 | Nakao | 349/143 |
| 2010/0314778 A1* | 12/2010 | Murai et al. | 257/774 |
| 2010/0320608 A1* | 12/2010 | Burton et al. | 257/768 |
| 2011/0299017 A1* | 12/2011 | Ataka et al. | 349/122 |

FOREIGN PATENT DOCUMENTS

| | | |
|---|---|---|
| JP | 11-103069 | 4/1999 |
| JP | 2003-076300 | 3/2003 |
| JP | 2004-318063 | 11/2004 |

(Continued)

OTHER PUBLICATIONS

"Thin Film Transistor (TFT)"—definition from the Penguin Dictionary of Physics 2009.*

(Continued)

*Primary Examiner* — Johannes P Mondt
(74) *Attorney, Agent, or Firm* — K&L Gates LLP

(57) ABSTRACT

A circuit substrate includes, on an insulating substrate, a plurality of devices, a plurality of conductive layers connected in one-to-one correspondence with the devices, and an insulating layer provided between the devices and the conductive layers. The insulating layer includes a first insulating layer covering the devices, a second insulating layer formed on the first insulating layer, and a plurality of contact holes each passing through the first and second insulating layers in a thickness direction thereof. Side surfaces of the first and second insulating layers contact each other in at least part of the inside of each contact hole. Each conductive layer extends along an upper surface of the second insulating layer, at least a part of a side surface of the contact hole in which the side surfaces of the first and second insulating layers contact each other, and a bottom surface of the contact hole.

8 Claims, 16 Drawing Sheets

(56) References Cited

FOREIGN PATENT DOCUMENTS

| | | |
|---|---|---|
| JP | 2009-133954 | 6/2009 |
| JP | 2011-145441 | 7/2011 |

OTHER PUBLICATIONS

Japanese Office Action issued Feb. 17, 2015 in corresponding Japanese Application No. 2012-024894.

\* cited by examiner

CIRCUIT SUBSTRATE, METHOD FOR MANUFACTURING THE SAME, AND ELECTROOPTICAL DEVICE

CROSS REFERENCES TO RELATED APPLICATIONS

The present application claims priority to Japanese Priority Patent Application JP 2012-024894 filed in the Japan Patent Office on Feb. 8, 2012, the entire content of which is hereby incorporated by reference.

BACKGROUND

The present application relates to a circuit substrate that includes an insulating substrate such as a glass substrate on which a driving circuit is provided to drive pixels, and a method for manufacturing the circuit substrate. The present application also relates to an electrooptical device including the circuit substrate.

In an active matrix type panel, a thin film transistor (TFT) is used as a switching device in a pixel circuit. The TFT is formed with a pixel electrode and signal wiring on an insulating substrate such as a glass substrate (see, for example, Japanese Unexamined Patent Application Publication No. 2011-145441).

SUMMARY

In the above-described panel, for example, a first insulating layer made of an inorganic material such as SiN, and a second insulating layer made of a resin material such as acryl are provided between the TFT and a pixel electrode. The first insulating layer entirely covers the TFT, and the second insulating layer has a planar surface as an upper surface on which the pixel electrode is formed. The pixel electrode is connected to a drain electrode of the TFT through a contact hole which passes through the insulating layers. When the pixel electrode is in the form of a thin layer, the pixel electrode is formed so as to extend along an inner surface (side and bottom surfaces) of the contact hole. However, since the first insulating layer and the second insulating layer are separately etched in separate processes in forming the contact hole, a stair-like step might be generated at a boundary of an opening in the first insulating layer and an opening in the second insulating layer, and the stair-like step might cause the generation of a stepped cut in the pixel electrode.

In the circuit substrate in which conductive layers such as an electrode and wiring are formed, similarly, such a stepped cut is possibly generated along the side surface of the contact hole passing through a plurality of stacked layers.

In view of the above-described points, the present application has been devised, and it is desired to provide a circuit substrate in which disconnection caused by a stepped cut rarely occurs at a side surface of a contact hole, a method for manufacturing the circuit substrate, and an electrooptical device including the circuit substrate.

A circuit substrate according to an embodiment of the present application includes a plurality of devices, a plurality of conductive layers connected in one-to-one correspondence with the devices, and an insulating layer provided between the devices and the conductive layers, the devices, the conductive layers, and the insulating layer being provided on an insulating substrate. The insulating layer includes a first insulating layer covering the devices and a second insulating layer formed on the first insulating layer. The insulating layer further includes a plurality of contact holes each passing through the first insulating layer and the second insulating layer in a thickness direction thereof. A side surface of the first insulating layer and a side surface of the second insulating layer contact each other in at least part of the inside of each of the contact holes. The conductive layers are formed so that each of the conductive layers extends along an upper surface of the second insulating layer, at least a part of a side surface of a corresponding one of the contact holes in which the side surface of the first insulating layer and the side surface of the second insulating layer contact each other, and a bottom surface of the contact hole.

An electrooptical device according to another embodiment of the present application includes an electrooptical panel including a circuit substrate. The circuit substrate of the electrooptical device has the same elements as those of the circuit substrate described above.

In the circuit substrate and the electrooptical device according to embodiments of the present application, the plurality of contact holes each passing through the first insulating layer and the second insulating layer in a thickness direction thereof are provided between the devices and the conductive layers. A side surface of the first insulating layer and a side surface of the second insulating layer contact each other in at least part of the inside of each of the contact holes. Thus, a continuous side surface which does not include a stair-like step is provided in at least part of the inside of each contact hole.

A method for manufacturing a circuit substrate according to still another embodiment of the present application includes (A) forming, after forming a plurality of devices on an insulating substrate, a first insulating layer covering the devices and a second insulating layer covering the first insulating layer, (B) forming, after forming a first opening passing through the second insulating layer, a resist layer having a second opening through which the entirety or part of a bottom surface of the first opening and part of a side surface of the first opening are exposed, (C) forming in the first insulating layer a third opening which contacts at least part of the side surface of the first opening and through which part of a corresponding one of the devices is exposed by selectively etching the first insulating layer and the second insulating layer using the resist layer as a mask, and then, removing the resist layer, and (D) forming conductive layers so that each of the conductive layers extends along an upper surface of the second insulating layer, a part in which the side surface of the first opening and a side surface of the third opening contact each other, and the part of the device exposed at a bottom surface of the third opening.

In the above-described method according to an embodiment of the present application, a pair of the first opening and the third opening (which will be hereinafter referred to as a "contact hole") passing through the first insulating layer and the second insulating layer in the thickness direction thereof is provided between the devices and the conductive layers. A side surface of the first opening and a side surface of the third opening contact each other in at least part of the contact hole. Thus, a continuous side surface which does not include a stair-like step is provided in at least part of the inside of each contact hole.

According to embodiments of the present application, in a circuit substrate, a method for manufacturing a circuit substrate, and an electrooptical device, a continuous side surface which does not include a stair-like step may be provided in at least part of the inside of each contact hole, and thus may allow a configuration in which disconnection caused by a stepped cut rarely occurs at a side surface of the contact hole.

Additional features and advantages are described herein, and will be apparent from the following Detailed Description and the figures.

DETAILED DESCRIPTION

Embodiments for implementing the present application will be hereinafter described in detail with reference to the accompanying drawings. Note that the description will be given in the following order:
1. First Embodiment (circuit substrate)
2. Second Embodiment (display device)
3. Third Embodiment (imaging device)
4. Application Example (electronic device)

1. First Embodiment

Configuration

Figure 1:
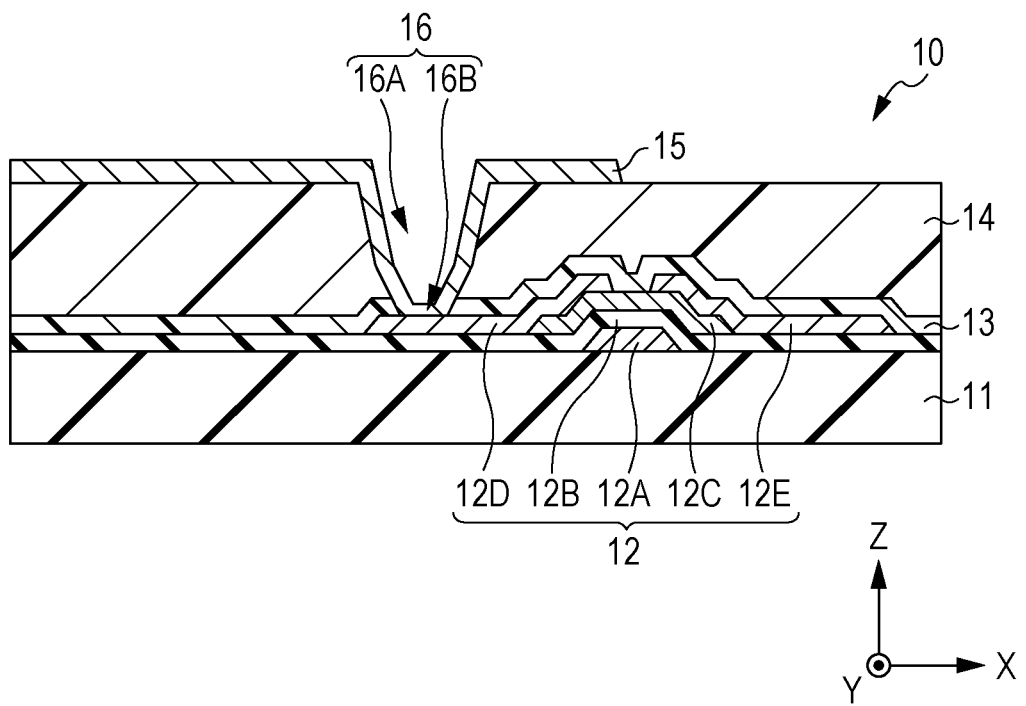
FIG. 1 is a cross-sectional view showing a cross-sectional configuration of a circuit substrate according to a first embodiment of the present application.

FIG. 1 is a cross-sectional view showing an example cross-sectional configuration of a circuit substrate 10 according to a first embodiment of the present application. The circuit substrate 10 is used for an electrooptical device such as a display device or a light receiving device, and, for example, includes on an insulating substrate 11 a plurality of thin film transistors (TFTs) 12, a plurality of electrodes 15 connected in one-to-one correspondence with the TFTs 12, and an insulating layer (a protective film 13 and a planarizing layer 14) provided between the TFTs 12 and the electrodes 15. Note that the TFTs 12 correspond to a specific example of "devices" in the present application, and the electrodes 15 correspond to a specific example of "conductive layers" in the present application. In addition, the protective film 13 corresponds to a specific example of a "first insulating layer" in the present application, and the planarizing layer 14 corresponds to a specific example of a "second insulating layer" in the present application.

The insulating substrate 11 is a substrate on which the TFTs 12 and the like are to be formed in a manufacturing process, and is, for example, a glass substrate or a resin substrate. Each of the TFTs 12 includes, for example, a gate electrode 12A, a gate insulating film 12B covering the gate electrode 12A and the insulating substrate 11, and a semiconductor layer 12C arranged so as to oppose the gate electrode 12A with the gate insulating film 12B interposed therebetween. The semiconductor layer 12C extends in a direction perpendicular to the gate electrode 12A and is made of, for example, a-Si and n$^+$Si. The TFT 12 further includes, for example, a drain electrode 12D contacting one end of the semiconductor layer 12C and a source electrode 12E contacting the other end of the semiconductor layer 12C.

The protective film 13 is a passivation film covering the drain electrode 12D and the source electrode 12E, and is made of, for example, an inorganic material such as SiN. The planarizing layer 14 is an insulating layer which is a thick film having a planar surface as an upper surface, and is made of, for example, a resin material such as a photosensitive resin (specifically, a photosensitive acrylic resin).

The electrode 15 is provided, for example, to allow a voltage to be applied from a TFT 12 side to an electrooptical device (not shown) which is formed so as to contact a surface of the electrode 15. The electrode 15 is used, for example, as a pixel electrode of a display panel or a pixel electrode of a light receiving panel. When the electrode 15 is used as a pixel electrode of a display panel, the electrooptical device is configured to include a liquid crystal layer. On the other hand, when the electrode 15 is used as a pixel electrode of an imaging panel, the electrooptical device is configured to include a light receiving device. The electrode 15 is formed so as to extend along a part of the planar surface of the planarizing layer 14 and the entirety of an inner surface (side and bottom surfaces) of a contact hole 16, which will be described later, and is formed in the form of a thin layer. Note that FIG. 1 shows, as an example, a case where the electrode 15 is formed so as to extend along a part of the upper surface of the planarizing layer 14 and the entirety of the inner surface (the side and bottom surfaces) of the contact hole 16.

The circuit substrate 10 further includes a plurality of contact holes 16 each passing through the protective film 13 and the planarizing layer 14 in a thickness direction thereof. Each of the contact holes 16 is formed immediately above the drain electrode 12D of a corresponding one of the TFTs 12. Note that, although not shown in FIG. 1, the contact hole 16 may be formed immediately above the source electrode 12E of the TFT 12. The protective film 13 and the planarizing layer 14 are exposed at the side surface of the contact hole 16, and the drain electrode 12D of the TFT 12 is exposed at the bottom surface of the contact hole 16. A part of the protective film 13 corresponding to the contact hole 16 is referred to as an opening 16B, and the opening 16B forms a lower portion of the contact hole 16. On the other hand, a part of the planarizing layer 14 corresponding to the contact hole 16 is referred to as an opening 16A, and the opening 16A forms an upper portion of the contact hole 16.

Figure 2A:
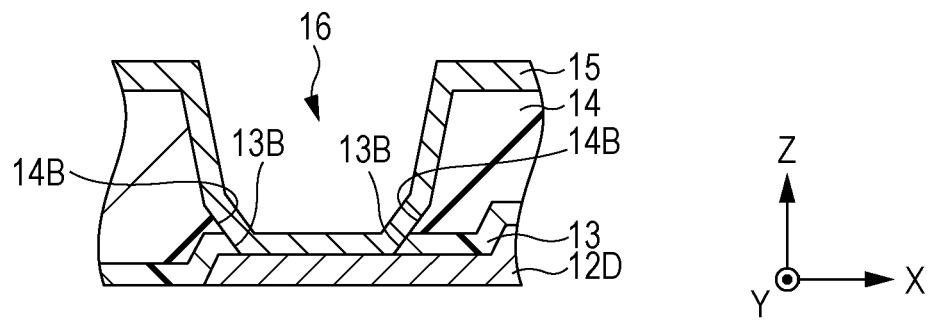
FIGS. 2A and 2B are cross-sectional views each showing an example cross-sectional configuration of a contact hole of FIG. 1.
Figure 2B:
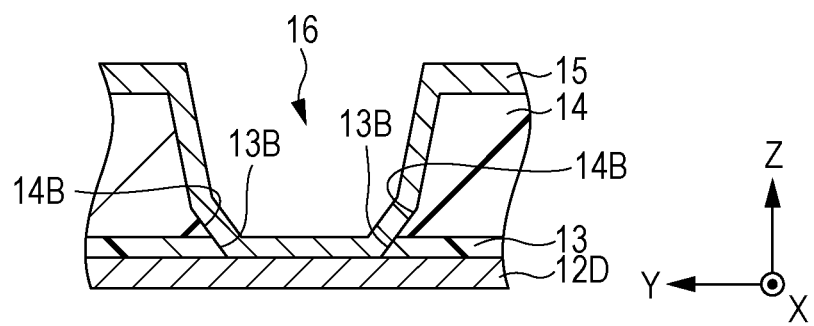
Figure 2C:
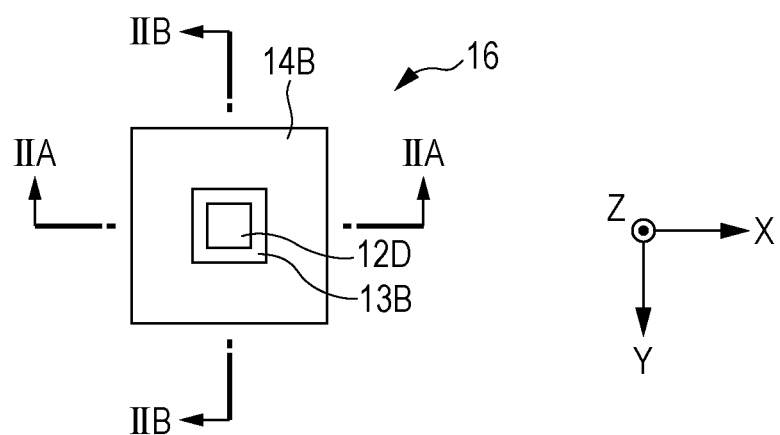
FIG. 2C is a plan view of an example planar configuration of the contact hole of FIG. 1.

FIGS. 2A and 2B are cross-sectional views each showing an example cross-sectional configuration of the contact hole 16 and a part in the vicinity of the contact hole 16. FIG. 2C is a plan view showing an example planar configuration of the contact hole 16 when the side and bottom surfaces of the contact hole 16 are viewed from a direction normal to the insulating substrate 11. Note that the cross-sectional configuration of FIG. 2A corresponds to a cross-sectional configuration taken along the line IIA-IIA of FIG. 2C, and a cross-sectional configuration of FIG. 2B corresponds to a cross-sectional configuration taken along the line IIB-IIB of FIG. 2C.

A side surface 13B of the protective film 13 and a side surface 14B of the planarizing layer 14 are exposed at the side surface of the contact hole 16. The side surface 13B has a loop shape with a small width when viewed from the direction normal to the insulating substrate 11, and contacts the drain electrode 12D at its inner side. The side surface 14B has a loop shape with a larger width than that of the side surface 13B when viewed from the direction normal to the insulating substrate 11, and contacts the side surface 13B at its inner side. That is, the side surface 13B and the side surface 14B contact each other in a loop shape, and there is no stair-like step at a boundary of the side surface 13B and the side surface 14B. In a part in which the side surface 13B and the side surface 14B contact each other, an inclination angle of the side surface 13B and an inclination angle of the side surface 14B may be the same or may be different from each other. In either case, however, the inclination angle of each of the side surface 13B and the side surface 14B with the insulating substrate 11 is not 90 degrees. This is because the part in which the side surface 13B and the side surface 14B contact each other is formed by etching the planarizing layer 14 simultaneously with the protective film 13 in a manufacturing process of forming the opening 16B corresponding to the lower portion of the contact hole 16 in the protective film 13, as will be described below.

Figure 3A:
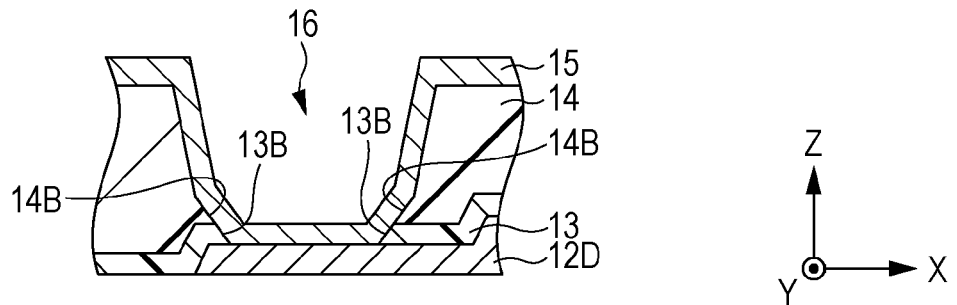
FIGS. 3A and 3B are cross-sectional views each showing another example cross-sectional configuration of the contact hole of FIG. 1.
Figure 3B:
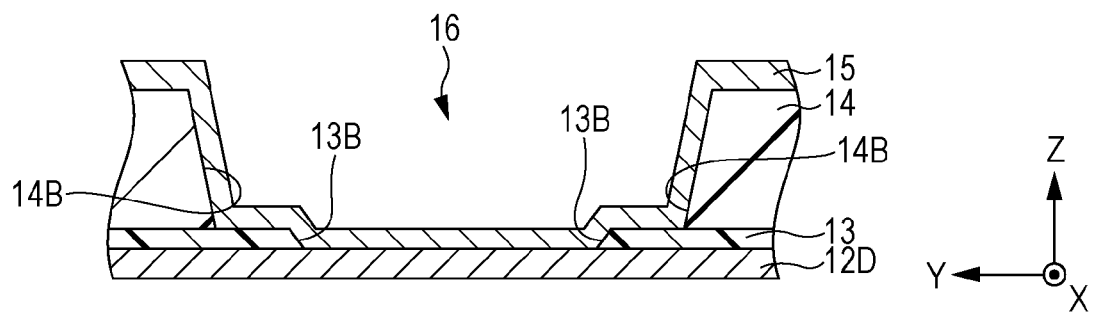
Figure 3C:
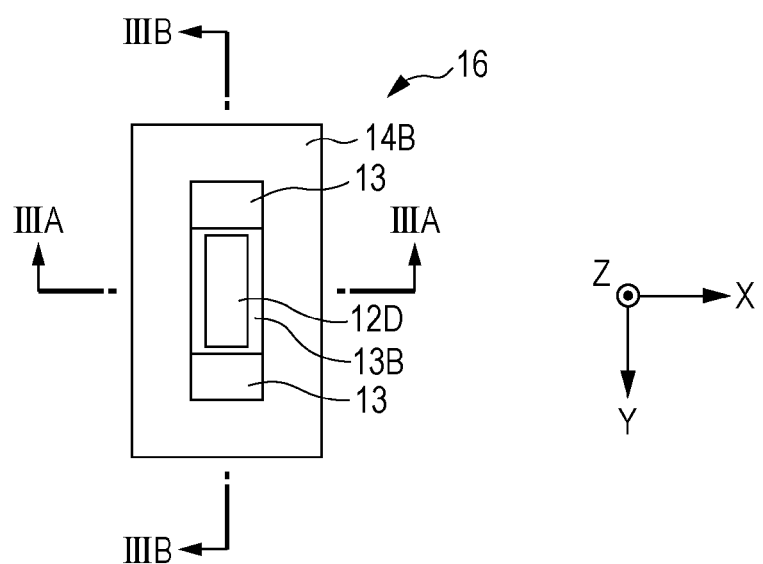
FIG. 3C is a plan view of another example planar configuration of the contact hole of FIG. 1.

The contact hole 16 is not limited to the configuration shown in FIGS. 2A to 2C, but may have a configuration shown in FIGS. 3A to 3C. Note that FIGS. 3A and 3B are cross-sectional views each showing another example cross-sectional configuration of the contact hole 16 and the part in the vicinity of the contact hole 16. FIG. 3C is a plan view showing another example planar configuration of the contact hole 16 when the side and bottom surfaces of the contact hole 16 are viewed from the direction normal to the insulating substrate 11. Note that the cross-sectional configuration of the FIG. 3A corresponds to a cross-sectional configuration taken along the line IIIA-IIIA of FIG. 3C, and a cross-sectional configuration of FIG. 3B corresponds to a cross-sectional configuration taken along the line IIIB-IIIB of FIG. 3C.

The side surface 13B of the protective film 13, the side surface 14B of the planarizing layer 14, and an upper surface of the protective film 13 are exposed at the side surface of the contact hole 16. When viewed from the direction normal to the insulating substrate 11, the side surface 13B has a loop shape with a small width, and contacts the drain electrode 12D at its inner side. In addition, when viewed from the direction normal to the insulating substrate 11, the side surface 13B has a loop shape having a longitudinal direction and a lateral direction. A width of the side surface 13B (specifically, the width of the side surface 13B when viewed from the direction normal to the insulating substrate 11) is greater in a part thereof extending in the longitudinal direction than in a part thereof extending in the lateral direction. That is, the inclination angle of the side surface 13B is more gentle in the part thereof extending in the longitudinal direction than in the part thereof extending in the lateral direction.

When viewed from the direction normal to the insulating substrate 11, the side surface 14B has a loop shape with a larger width than that of the side surface 13B, and contacts the side surface 13B (specifically, a part of the side surface 13B extending in the longitude direction) and the upper surface of the protective film 13 at its inner side. In addition, when viewed from the direction normal to the insulating substrate 11, the side surface 14B has a loop shape having a longitudinal direction and a lateral direction. A part of the side surface 14B extending in the longitudinal direction is parallel to the part of the side surface 13B extending in the longitudinal direction. The part of the side surface 14B extending in the longitudinal direction and the part of the side surface 13B extending in the longitudinal direction contact each other. A part of the side surface 14B extending in the lateral direction is parallel to the part of the side surface 13B extending the lateral direction. The part of the side surface 14B extending in the lateral direction and the part of the side surface 13B extending in the lateral direction do not contact each other, and the upper surface of the protective film 13 is exposed in a part between the part of the side surface 14B extending in the lateral direction and the part of the side surface 13B extending in the lateral direction.

In each of the example of FIGS. 2A to 2C and the example of FIGS. 3A to 3C, the side surface 13B and the side surface 14B contact each other in at least part of the inside of the contact hole 16. The electrode 15 is formed so as to extend along the part of the side surface of the contact hole 16 in which the side surface 13B and the side surface 14B contact each other, a part of the upper surface of the planarizing layer 14 located outside the contact hole 16, and the bottom surface of the contact hole 16.

[Manufacturing Method]

Figure 4:
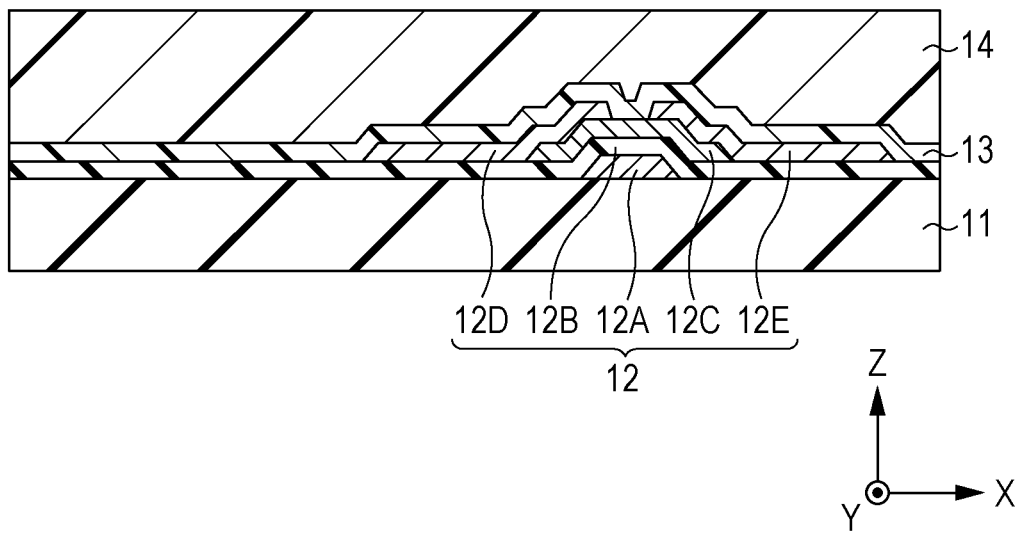
FIG. 4 is a cross-sectional view showing an example process for manufacturing the circuit substrate of FIG. 1.
Figure 5:
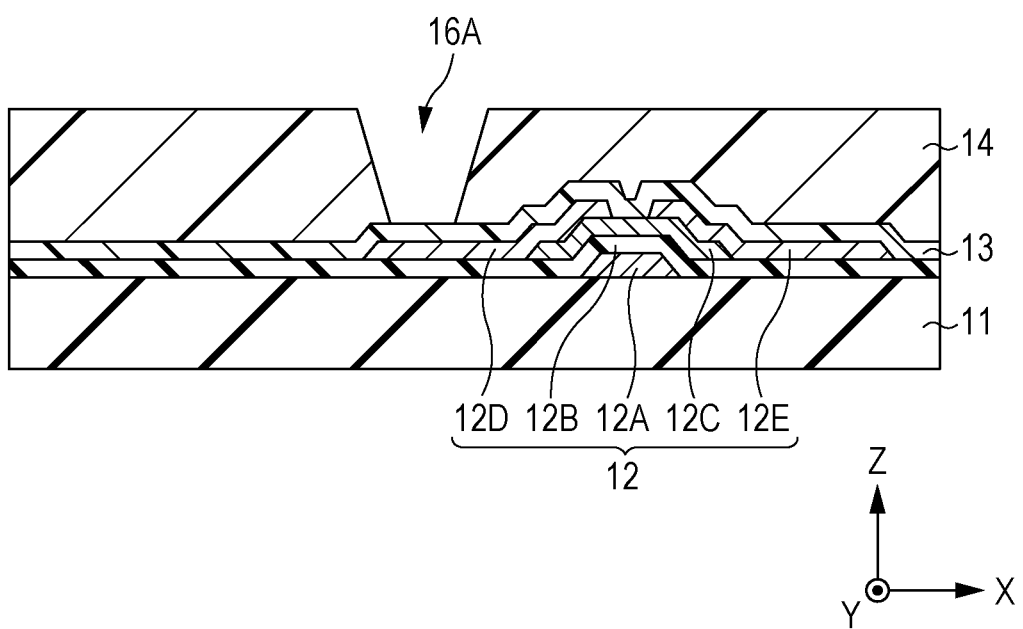
FIG. 5 is a cross-sectional view showing an example process subsequent to the process of FIG. 4.

Next, an example method for manufacturing a circuit substrate 10 will be described with reference to FIGS. 4 to 10. First, TFTs 12, a protective film 13, and a planarizing layer 14 are formed on an insulating substrate 11 in this order (FIG. 4). Next, an opening 16A (a first opening) is formed to pass through the planarizing layer 14 by etching (wet etching) (FIG. 5). For example, although not shown in FIG. 5, after applying a photosensitive acrylic resin in an uncured state onto the protective film 13, a mask is disposed in a part in which an opening 16A is to be formed, the photosensitive resin as well as the mask is irradiated with an ultraviolet ray to partially cure the photosensitive resin, and then, a part of the photosensitive resin which has not been exposed to the ultraviolet ray is removed by etching (wet etching), thereby forming a planarizing layer 14 having an opening 16A.

Figure 6:
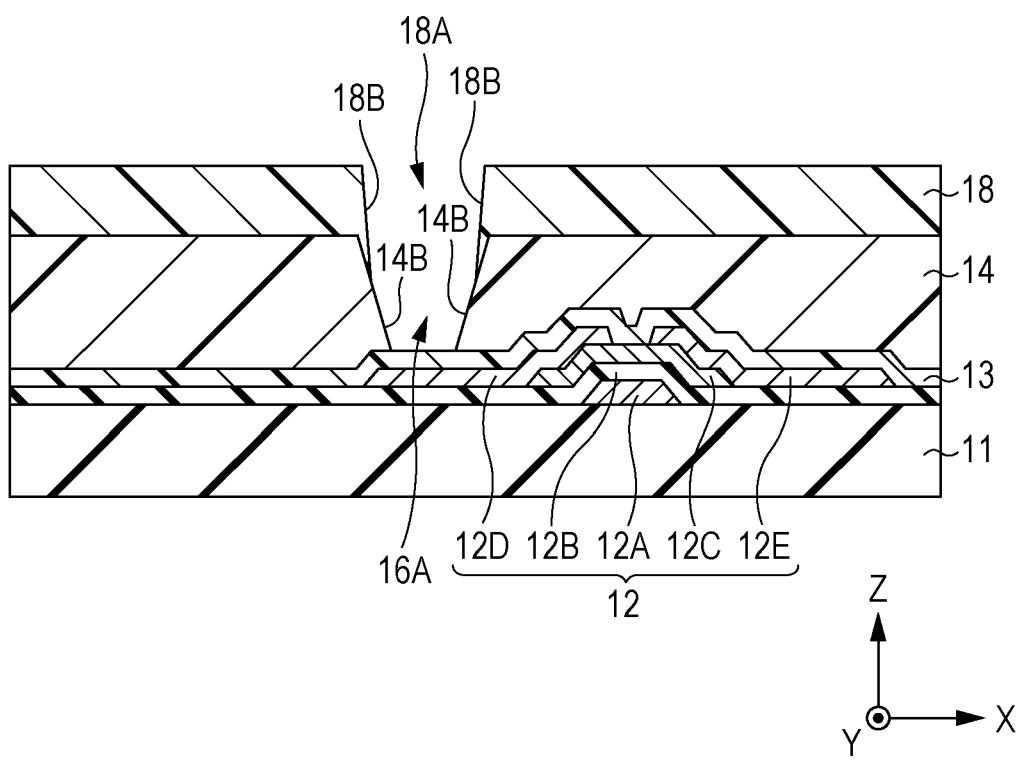
FIG. 6 is a cross-sectional view showing an example process subsequent to the process of FIG. 5.
Figure 7A:
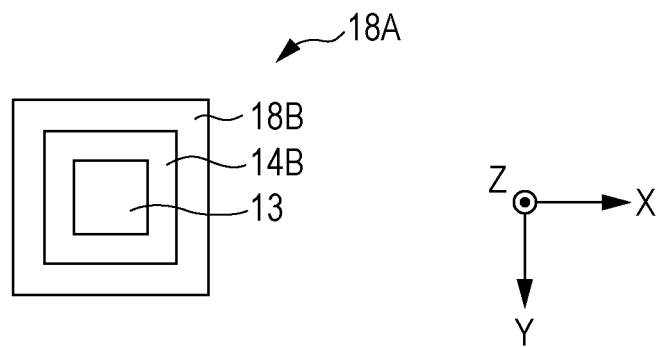
FIGS. 7A and 7B are plan views each showing an example planar configuration of an opening of FIG. 6.

Next, a resist layer 18 having an opening 18A (a second opening) through which the entirety or part of a bottom surface of the opening 16A and part of a side surface of the opening 16A are exposed is formed (FIG. 6). In the forming, when the opening 18A is formed so that the entirety of the bottom surface of the opening 16A and the entirety of a loop-shaped part of the side surface of the opening 16A which contacts the bottom surface of the opening 16A are exposed, the side surface of the opening 16A (a side surface 14B of the planarizing layer 14) and the bottom surface of the opening 16A (an upper surface of the protective film 13) contact each other in a loop shape (FIG. 7A).

Figure 7B:
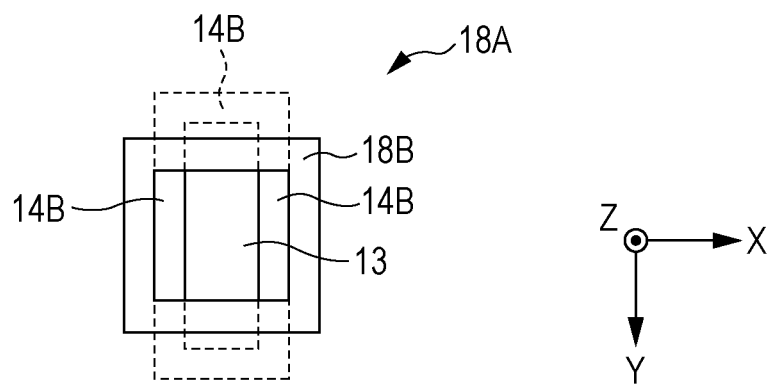

On the other hand, when the opening 18A is formed so that only a part of the bottom surface of the opening 16A and a part of a loop-shaped part of the side surface of the opening 16A which contacts the bottom surface of the opening 16A are exposed, the side surface of the opening 16A (the side surface 14B of the planarizing layer 14) and the bottom surface of the opening 16A (the upper surface of the protective film 13) contact each other in a linear shape (FIG. 7B). In this case, the opening 18A is provided in the resist layer 18 by a subsequent etching process so that when viewed from the direction normal to the insulating substrate 11, each of the side surface 13B and the side surface 14B has a loop shape having a longitudinal direction and a lateral direction and a part of the side surface 13B extending in the longitudinal direction and a part of the side surface 14B extending in the longitudinal direction contact each other (FIG. 7B).

Figure 8:
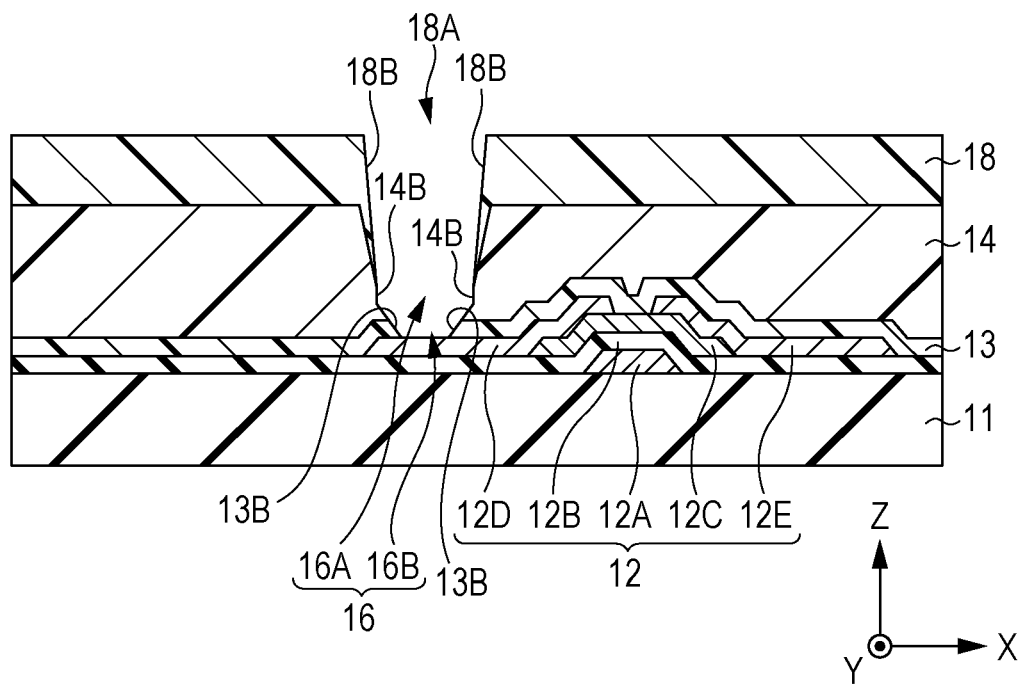
FIG. 8 is a cross-sectional view showing an example process subsequent to the process of FIG. 6.
Figure 9:
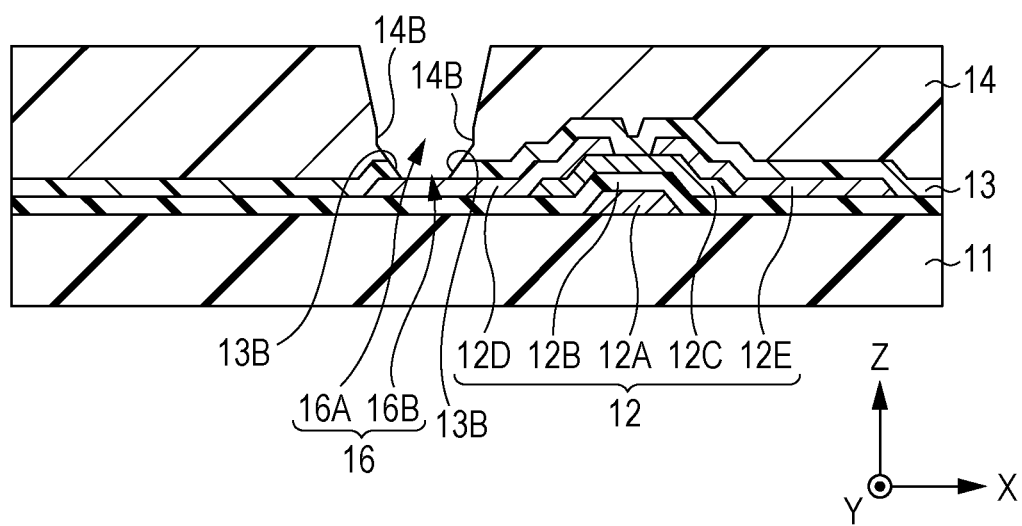
FIG. 9 is a cross-sectional view showing an example process subsequent to the process of FIG. 8.

Next, using the resist layer 18 as a mask, the protective film 13 and the planarizing layer 14 are selectively etched (dry etched), thereby forming in the protective film 13 an opening 16B (a third opening) which contacts at least part of the side surface of the opening 16 (the side surface 14B of the planarizing layer 14) and through which part (a drain electrode 12D) of the TFT 12 is exposed (FIG. 8). Thereafter, the resist layer 18 is removed (FIG. 9).

Figure 10A:
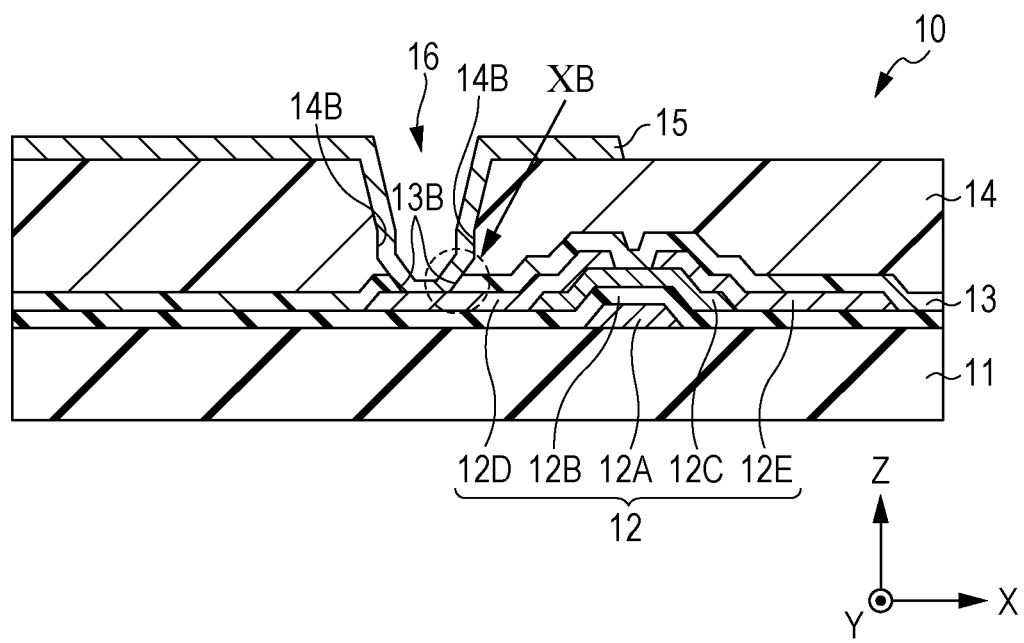
FIG. 10A is a cross-sectional view showing an example process subsequent to the process of FIG. 9.

Next, electrodes 15 are formed. Specifically, the electrode 15 is formed so as to extend along an upper surface of the planarizing layer 14, a part in which the side surface of the opening 16A and the side surface of the opening 16B contact each other, and the part (the drain electrode 12D) of the TFT 12 exposed at a bottom surface of the opening 16B (FIG. 10A). Note that FIG. 10A shows, as an example, a case where the electrode 15 is formed so as to extend along the upper surface of the planarizing layer 14 and the entirety of the inner surface (the side and bottom surfaces) of the opening 16. Thus, a circuit substrate 10 is completed.

Figure 10B:
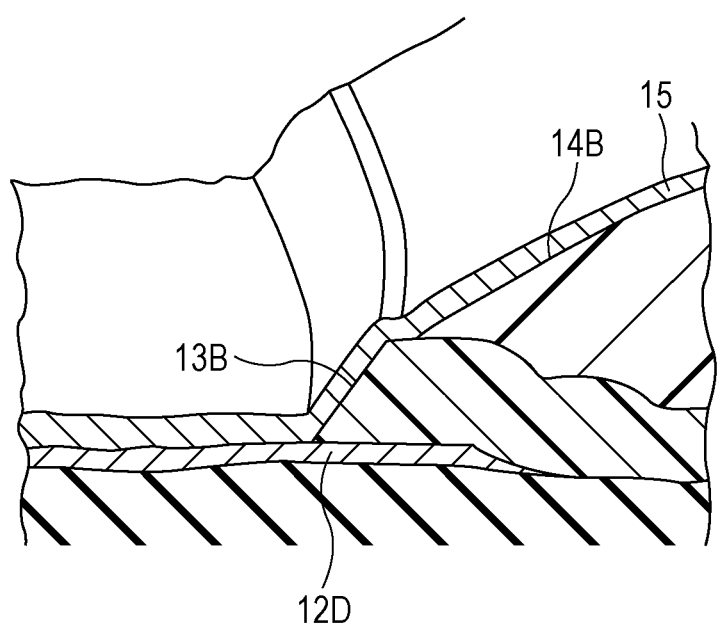
FIG. 10B is an enlarged view of a part surrounded by a broken line in FIG. 10A.

In a part surrounded by a broken line in FIG. 10A (i.e., the bottom surface of the contact hole 16), as shown in an enlarged view of FIG. 10B, the side surface 13B and the side surface 14B contact each other, and there is no stair-like step at a boundary of the side surface 13B and the side surface 14B. Therefore, a stepped cut is not generated at the boundary of the side surface 13B and the side surface 14B in the electrode 15.

[Advantages]

Next, advantages of the circuit substrate 10 and the method for manufacturing the circuit substrate 10 will be described with reference to a comparative example.

Figure 11:
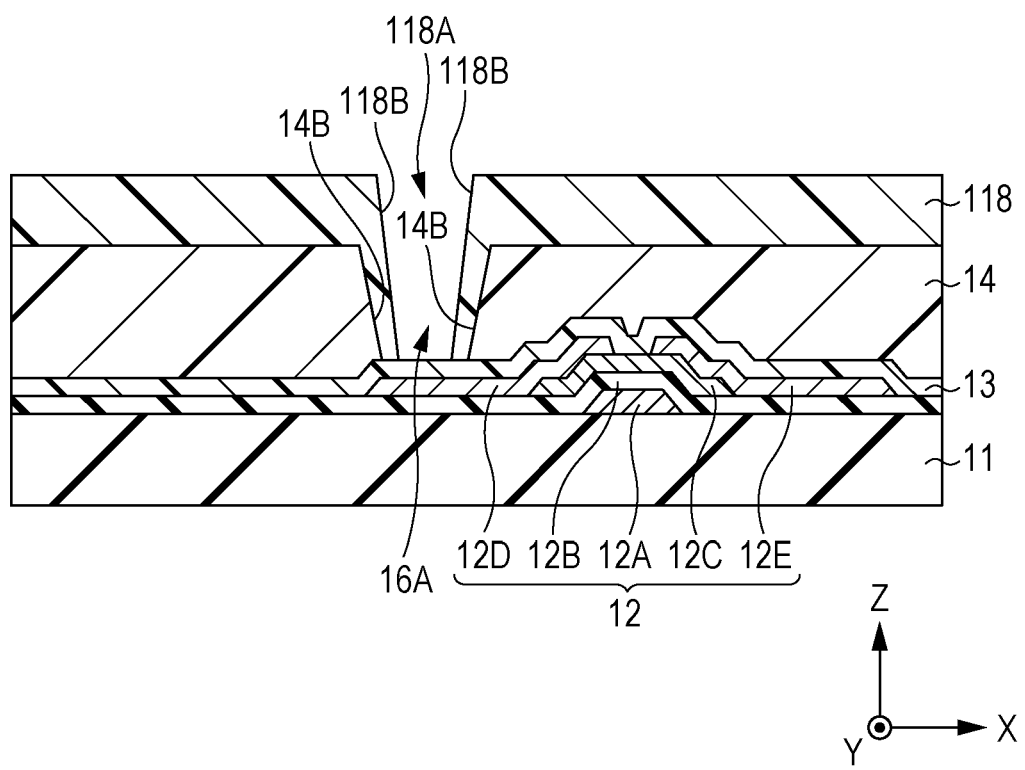
FIG. 11 is a cross-sectional view showing an example process for manufacturing a circuit substrate according to a comparative example.
Figure 12:
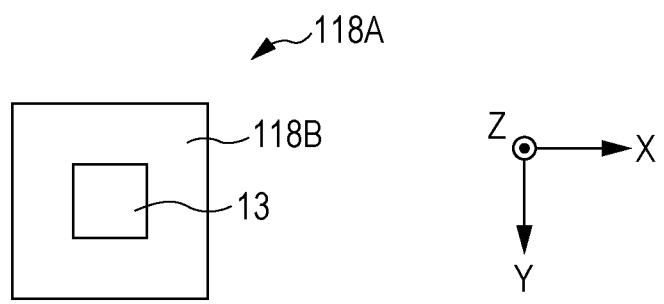
FIG. 12 is a plan view showing an example planar configuration of an opening of FIG. 11.
Figure 13:
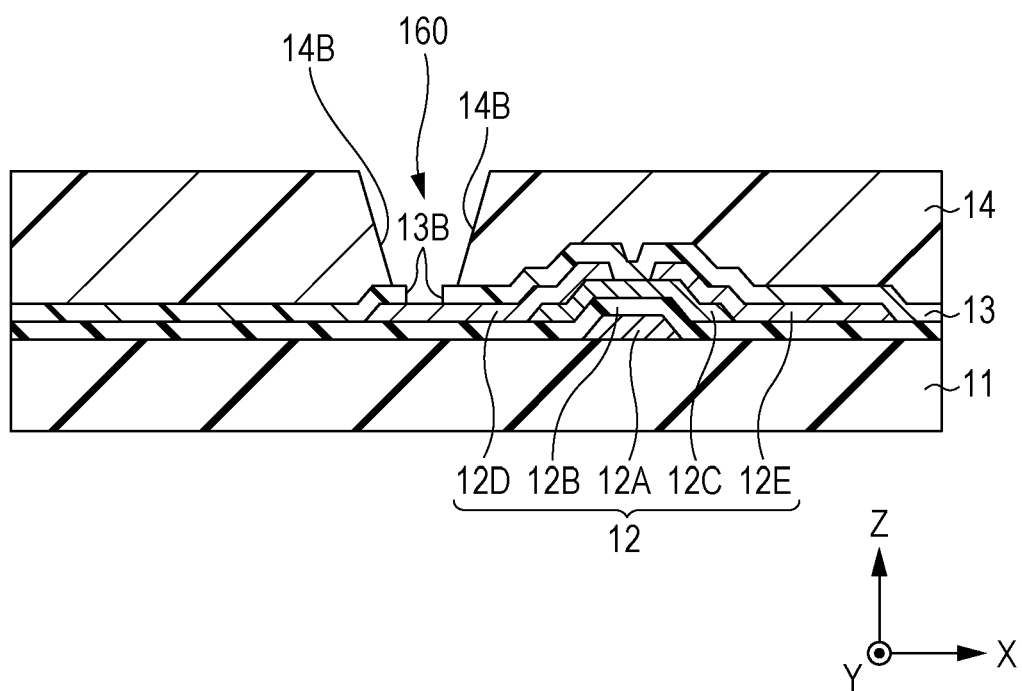
FIG. 13 is a cross-sectional view showing an example process subsequent to the process of FIG. 11.
Figure 14:
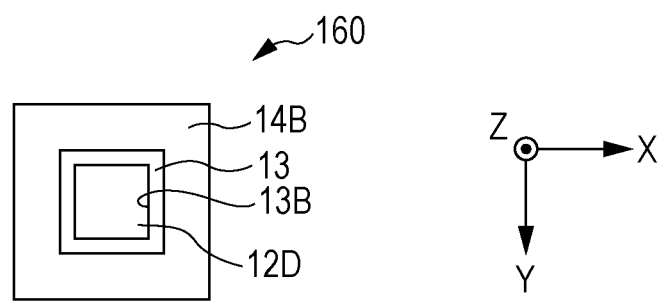
FIG. 14 is a plan view showing an example planar configuration of a contact hole of FIG. 13.
Figure 15:
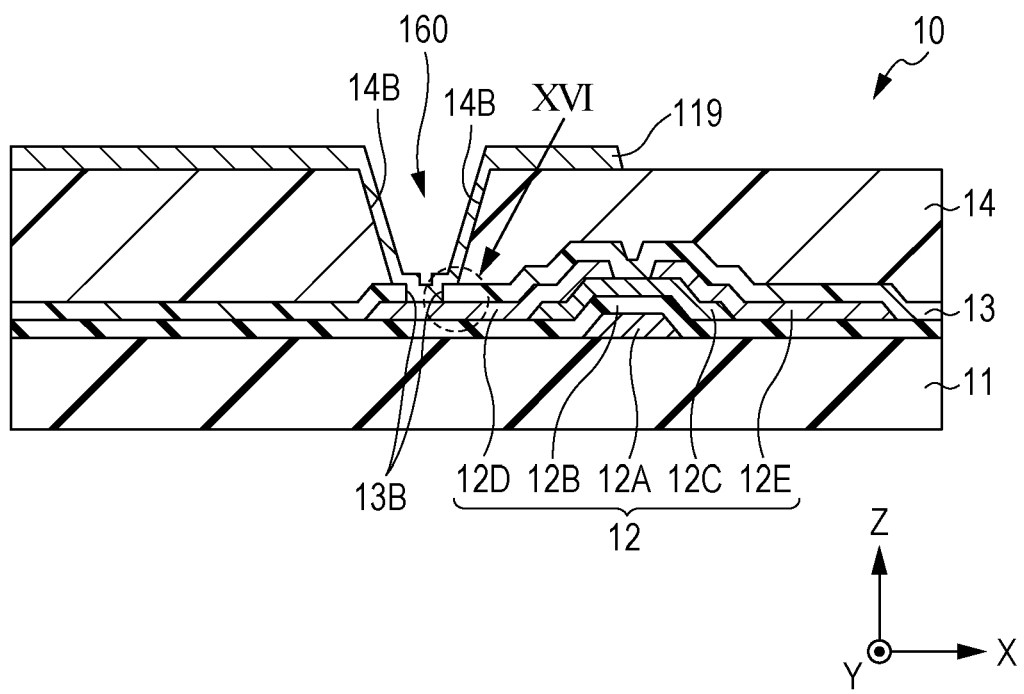
FIG. 15 is a cross-sectional view showing an example of a process subsequent to the process of FIG. 13.
Figure 16:
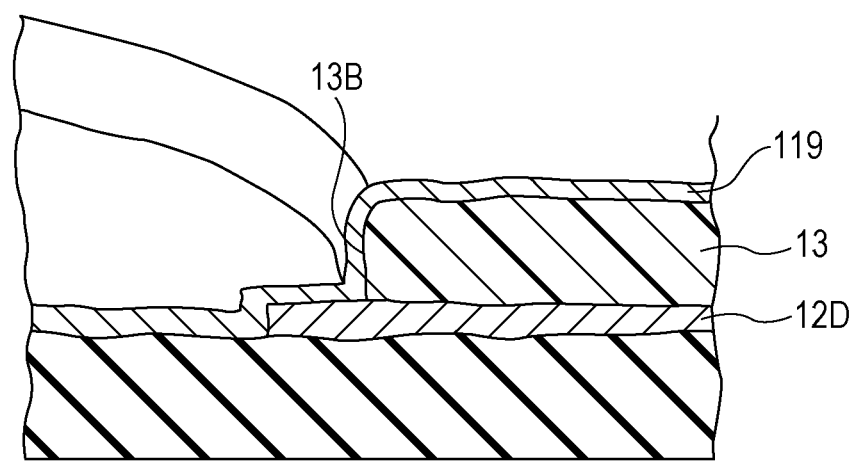
FIG. 16 is an enlarged view showing an example configuration of a lower portion of a contact hole of FIG. 15.

FIGS. 11 to 16 are views showing a process for manufacturing a circuit substrate according to a comparative example. As shown in FIGS. 11 and 12, when an opening 118A is formed after the process shown in FIG. 5 so that a resist layer 118 reaches the bottom surface of the opening 16A, a side surface 118B of the resist layer 118 does not contact the side surface 14B of the planarizing layer 14 but contacts the upper surface of the protective film 13. In the above-described state, if the protective film 13 is dry-etched using the resist layer 118 as a mask, not only the side surface 13B of the protective film 13 and the side surface 14B of the planarizing layer 14 but also the upper surface of the protective film 13 are exposed at a side surface of a contact hole 160, as shown in FIGS. 13 and 14. Furthermore, in this case, an inclination angle of the side surface 13B of the protective film 13 is very steep at the side surface of the contact hole 160. That is, a stair-like step is generated at the boundary of the side surface 13B and the side surface 14B. As a result, when an electrode 119 is formed, as shown in FIG. 15, so as to extend along the upper surface of the planarizing layer 14 and an inner surface of the contact hole 160, a stepped cut is generated, as seen from an enlarged view (FIG. 16) of a part surrounded by a broken line in FIG. 15, at a boundary of the side surface 13B of the protective film 13 and a drain electrode 12D in the electrode 119.

According to the embodiment of the disclosure, on the other hand, the plurality of contact holes 16 each passing through the protective film 13 and the planarizing layer 14 in the thickness direction thereof are provided between the TFTs 12 and the electrodes 15. The side surface 13B of the protective film 13 and the side surface 14B of the planarizing layer 14 contact each other in at least part of the inside of the contact hole 16. As has been described above, this is because the part in which the side surface 13B and the side surface 14B contact each other is formed by etching (dry-etching) the planarizing layer 14 simultaneously with the protective film 13 in the manufacturing process of forming in the protective film 13 the opening 16B corresponding to the lower portion of the contact hole 16. Thus, a continuous side surface which does not include a stair-like step is provided in at least part of the inside of the contact hole 16. Accordingly, disconnection caused by a stepped cut rarely occurs at the side surface of the contact hole 16.

2. Second Embodiment

Configuration

Figure 17:
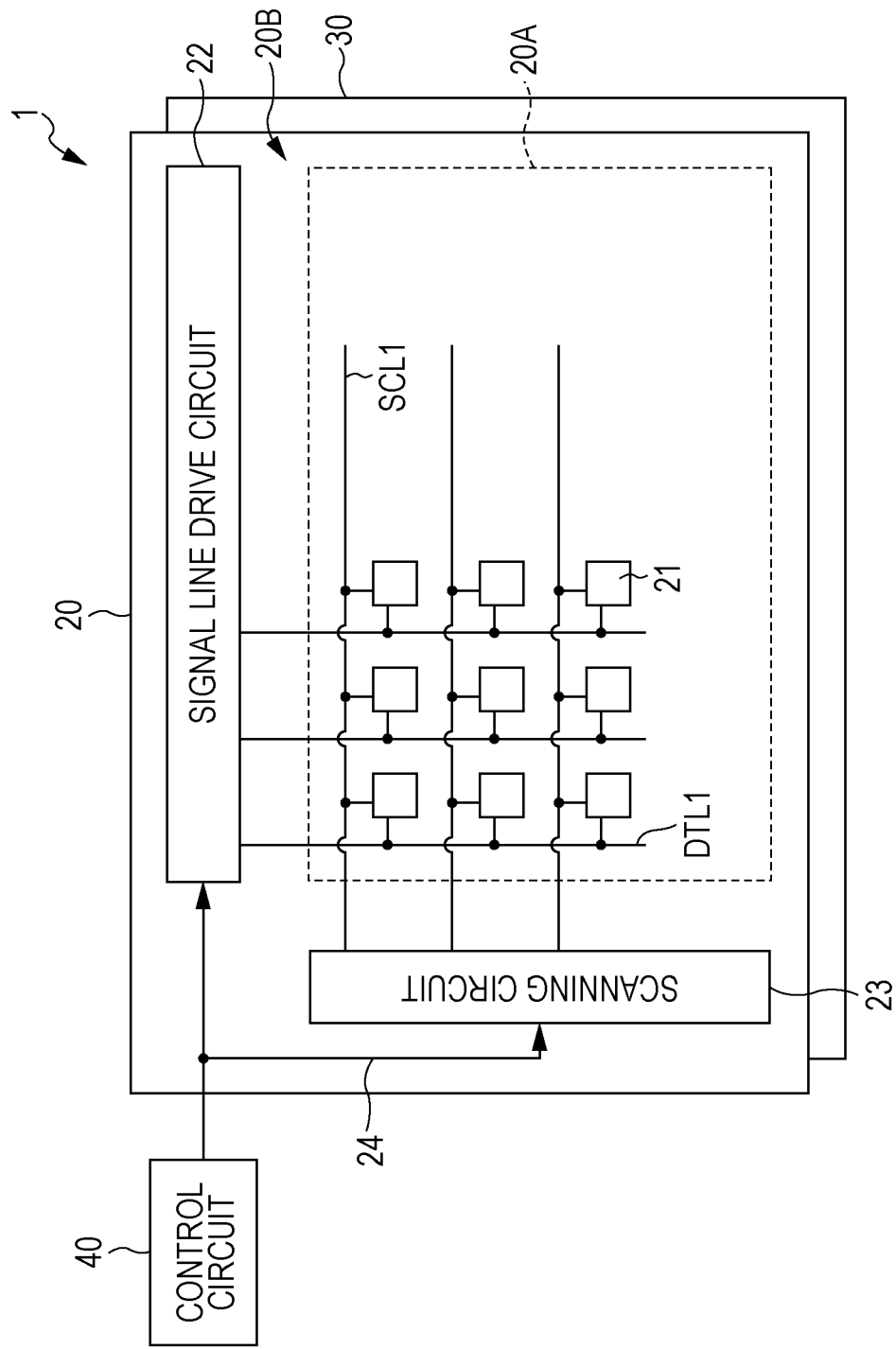
FIG. 17 is a diagram showing an entire configuration of a display device according to a second embodiment of the present application.

FIG. 17 is a diagram showing an entire configuration of a display device 1 according to a second embodiment of the present application. The display device 1 includes the circuit substrate 10 described above. The display device 1 includes, for example, a display panel 20, a back light 30 to illuminate the display panel 20 from behind, and a control circuit 40 to control the display panel 20. Note that the display device 1 corresponds to a specific example of an "electrooptical device" in the present application, and the display panel 20 corresponds to a specific example of an "electrooptical panel" in the present application.

The display panel 20 modulates light emitted from the back light 30 to display an image. The display panel 20 includes a pixel area 20A in which a plurality of display pixels 21 are arranged in a matrix, and a frame area 20B formed so as to surround the pixel area 20A. The frame area 20B includes a signal line drive circuit 22 and a scanning circuit 23 as a driving circuit to drive the display pixels 21. The frame area 20B further includes signal wiring 24 that electrically connects the signal line drive circuit 22 and the scanning circuit 23 to the control circuit 40. The display panel 20 is configured so that the display pixels 21 are active-driven by the signal line drive circuit 22 and the scanning circuit 23, thereby displaying an image based on an image signal received from the outside.

The display pixels 21 herein correspond to dots as minimum units constituting a screen on the display panel 20. For example, when the display panel 20 is a color display panel, the display pixels 21 correspond to sub-pixels each of which emits light of a single color of red, green, or blue, and when the display panel 20 is a monochrome display panel, the display pixels 21 correspond to pixels each of which emits white light.

Each of the display pixels 21 includes, for example, a liquid crystal layer (a liquid crystal layer 26 which will be described below), a pixel electrode (a pixel electrode 15 which will be described below) and a counter electrode (a counter electrode 29 which will be described below) which are provided so as to allow a voltage to be applied to the liquid crystal layer, and a switching device connected to the pixel electrode. The switching device is formed of a TFT (the TFT 12 described above). The counter electrode is a sheet-shaped electrode formed so as to extend over the entirety of the pixel area 20A and serves as a common electrode shared by the display pixels 21.

The display panel 20 includes a plurality of scanning lines SCL1 extending along rows and a plurality of signal lines DTL1 extending along columns. The display pixels 21 are provided at positions corresponding to intersections of the signal lines DTL1 and the scanning lines SCL1. Each of the signal lines DTL1 is connected to an output terminal (not shown) of the signal line drive circuit 22, and furthermore, is connected to, for example, a source or a drain of the TFT (the TFT 12 described above) in a corresponding one of the display pixels 21. Each of the scanning lines SCL1 is connected to an output terminal (not shown) of the scanning circuit 23, and furthermore, is connected to, for example, a gate of the TFT (the TFT 12 described above) in a corresponding one of the display pixels 21.

Figure 18:
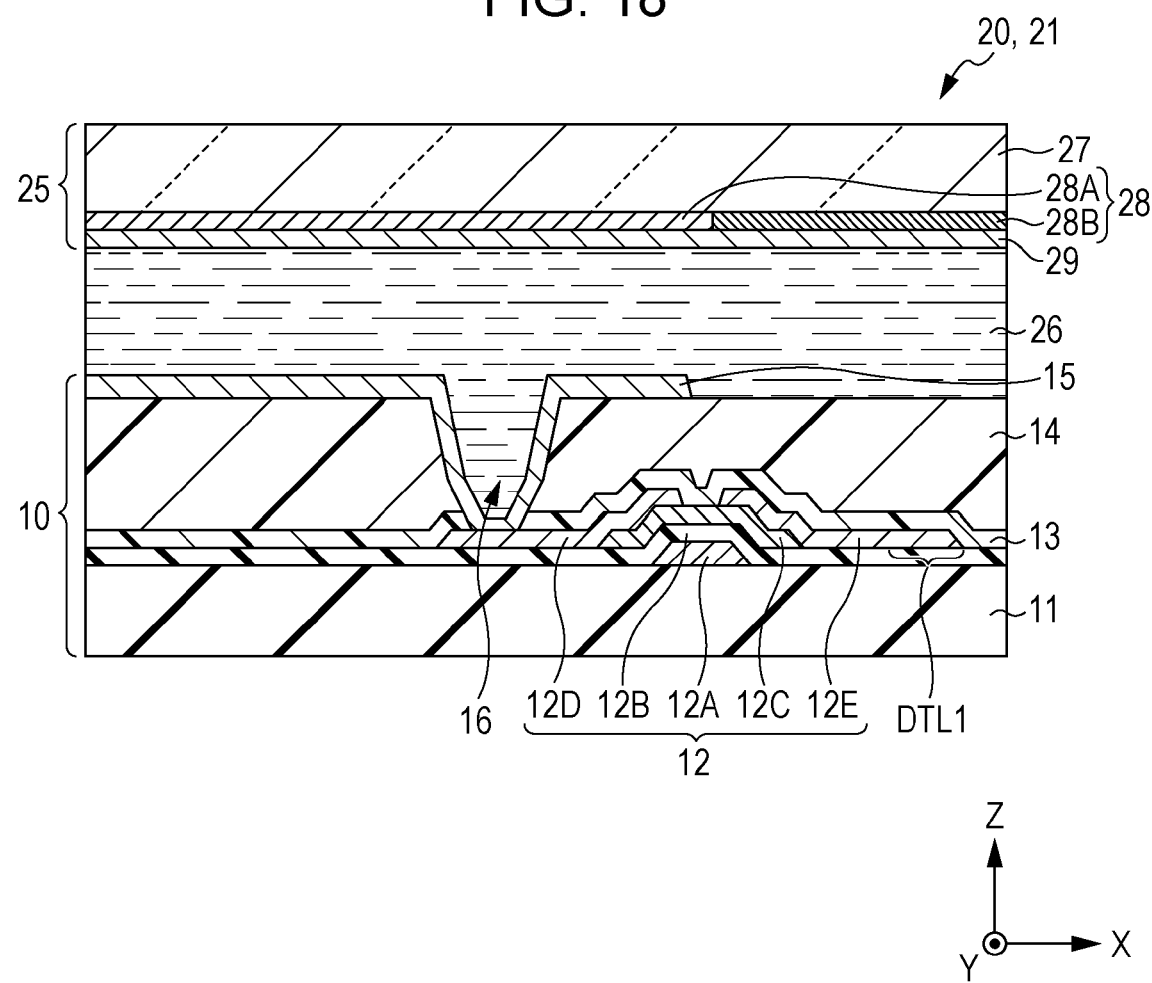
FIG. 18 is a cross-sectional view showing an example cross-sectional configuration of a display panel of FIG. 17.

FIG. 18 is a cross-sectional view showing an example cross-sectional configuration of the display panel 20. The display panel 20 includes the circuit substrate 10 according to the first embodiment, a counter substrate 25, and a liquid crystal layer 26 interposed between the substrates (the circuit substrate 10 and the counter substrate 25). Note that, although not shown in FIG. 18, the display panel 20 includes a polarizing plate on a lower side of the circuit substrate 10 and another polarizing plate on an upper side of the counter substrate 25. The counter substrate 25 includes, for example, a color filter 28 and a counter electrode 29 on a lower surface of a protective substrate 27 formed of a glass substrate or a transparent resin, etc. The color filter 28 includes a filter portion 28A in a part thereof opposing the electrode 15 as a pixel electrode and a black matrix 28B in other parts thereof.

The control circuit 40 is provided, for example, to store and hold image signals supplied thereto in a frame memory for each frame (for each display of one frame). The control circuit 40 also has, for example, a function of controlling the signal line drive circuit 22 and the scanning circuit 23 which are provided to drive the display panel 20 so that the signal line drive circuit 22 and the scanning circuit 23 operate in conjunction with each other. The control circuit 40 is configured, for example, to supply a scanning timing control signal to the scanning circuit 23 through the signal wiring 24. Furthermore, the control circuit 40 is configured, for example, to supply image signals for one horizontal line based on image signals held in the frame memory and a display timing control signal to the signal line drive circuit 22 through the signal wiring 24.

The signal line drive circuit 22 is provided, for example, to supply image signals for one horizontal line supplied from the control circuit 40 or a signal corresponding thereto to the display pixels 21. Specifically, the signal line drive circuit 22 is provided, for example, to supply image signals or a signal corresponding thereto to the display pixels 21 constituting one horizontal line selected by the scanning circuit 23 through the signal lines DTL1.

The scanning circuit 23 is provided to selectively scan the display pixels 21 for each pixel row. The scanning circuit 23 has, for example, a function of selecting display pixels 21 which are to be the target of drive for display according to the scanning timing control signal supplied from the control circuit 40. The scanning circuit 23 is, for example, configured to apply a selection pulse to the display pixels 21 through the scanning line SCL1 to select one row of a plurality of the display pixels 21 in the pixel area 20A as a target of drive for display. Then, display of one horizontal line is performed for each row of the display pixels 21 according to a signal supplied from the signal line drive circuit 22. Thus, the scanning circuit 23 performs scanning sequentially for each horizontal line in a time sharing manner to execute display of the entire pixel area 20A.

[Advantages]

Next, advantages of the display device 1 will be described. In the display device 1, as a circuit substrate of the display panel 20, the circuit substrate 10 of the first embodiment is used. Thus, disconnection of the electrode 15 caused by a stepped cut is less likely to occur in the contact hole 16. As a result, for example, even when the display panel 20 is formed to be an even higher definition display panel by forming the contact hole 16 with a further reduced width, a high yield can be achieved.

3. Third Embodiment

Configuration

Figure 19:
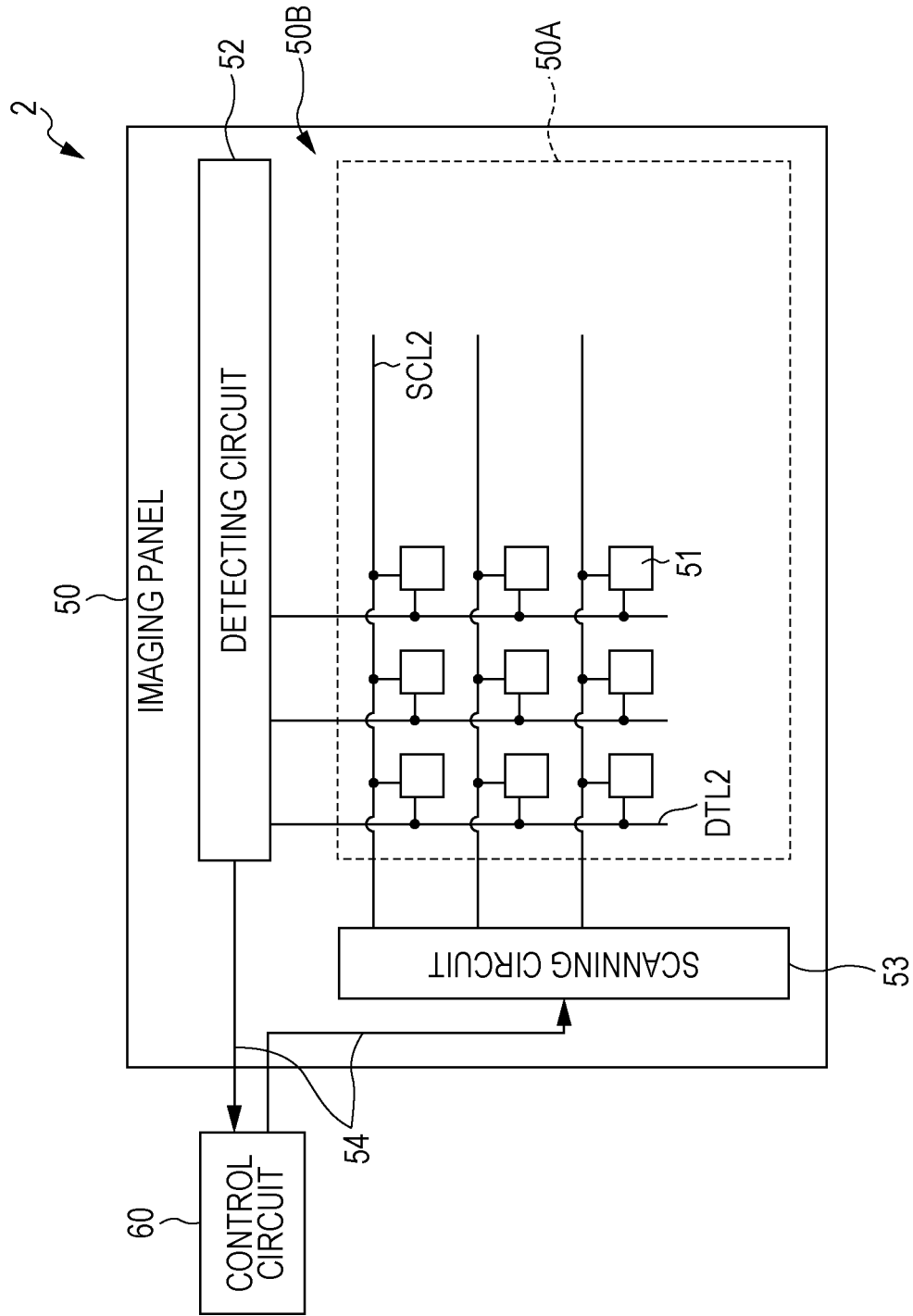
FIG. 19 is a diagram showing an entire configuration of an imaging device according to a third embodiment of the present application.

FIG. 19 is a diagram showing an entire configuration of an imaging device 2 according to a third embodiment of the present application. The imaging device 2 includes the circuit substrate 10 described above. The imaging device 2 includes, for example, an imaging panel 50, and a control circuit 60 to control the imaging panel 50. Note that the imaging device 2 corresponds to a specific example of an "electrooptical device" in the present application, and the imaging panel 50 corresponds to a specific example of an "electrooptical panel" in the present application.

The imaging panel 50 includes a pixel area 50A in which a plurality of light receiving pixels 51 are arranged in a matrix, and a frame area 50B formed so as to surround the pixel area 50A. The frame area 50B includes a scanning circuit 53 as a driving circuit to drive the light receiving pixels 51, and furthermore, a detecting circuit 52 to detect outputs from the light receiving pixels 51. The frame area 50B further includes signal wiring 54 that electrically connects the detecting circuit 52 and the scanning circuit 53 to the control circuit 60. The imaging panel 50 is configured to output, when the light receiving pixels 51 are sequentially selected by the scanning circuit 53, signals output from the light receiving pixels 51 as image signals to the outside according to the magnitude of light energy.

Each of the light receiving pixels 51 includes, for example, a light receiving device (a light receiving device 56 which will be described below), a pixel electrode (a pixel electrode 15 which will be described below) and a counter electrode (a counter electrode 58 which will be described below) which are provided so as to allow a voltage to be applied to the light receiving device, and a switching device connected to the pixel electrode. The switching device is formed of a TFT (the TFT 12 described above). The counter electrode is a strip-shaped electrode formed for each pixel column and serves as a common electrode shared in each pixel column.

The imaging panel 50 includes a plurality of scanning lines SCL2 extending along rows and a plurality of detecting lines DTL2 extending along columns. The light receiving pixels 51 are provided at positions corresponding to intersections of the detecting lines DTL2 and the scanning lines SCL2. Each of the detecting lines DTL2 is connected to an output terminal (not shown) of the detecting circuit 52, and furthermore, is connected to, for example, a source or a drain of the TFT (the TFT 12 described above) in a corresponding one of the receiving pixels 51. Each of the scanning lines SCL2 is connected to an output terminal (not shown) of the scanning circuit 53, and furthermore, is connected to, for example, a gate of the TFT (the TFT 12 described above) in a corresponding one of the light receiving pixels 51.

Figure 20:
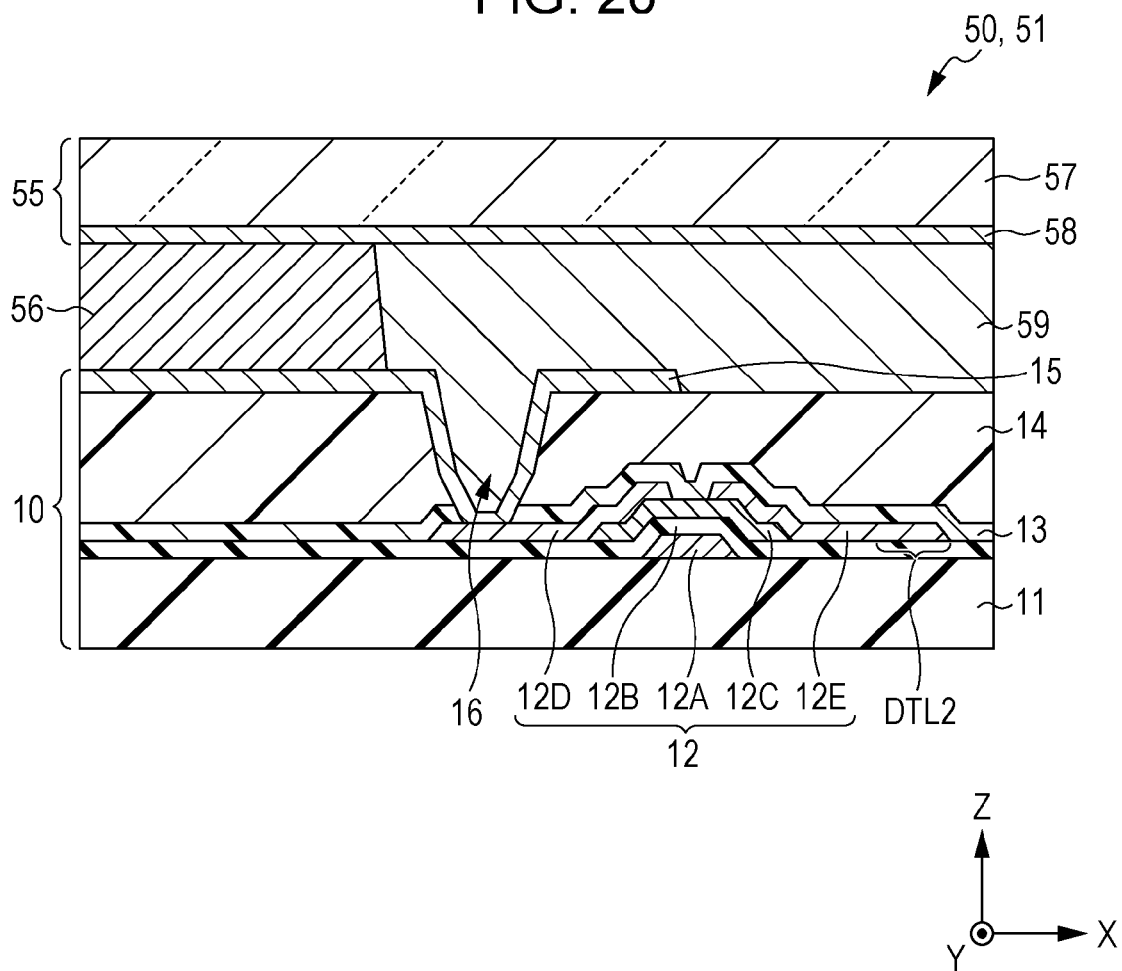
FIG. 20 is a cross-sectional view showing an example cross-sectional configuration of an imaging panel of FIG. 19.

FIG. 20 is a cross-sectional view showing an example cross-sectional configuration of the imaging panel 50. The imaging panel 50 includes the circuit substrate 10 of the first embodiment, a counter substrate 55, a light receiving device 56 interposed between the substrates (the circuit substrate 10 and the counter substrate 55), and an embedded layer 59 embedded to fill a part around the light receiving device 56. The counter substrate 55 includes, for example, a counter electrode 58 on a lower surface of a protective substrate 57 formed of a glass substrate or a transparent resin, etc. Although not shown in FIG. 20, the counter substrate 55 further includes, for example, a black matrix in a part thereof on which the light receiving device 56 is not formed.

[Advantages]

Next, advantages of the imaging device 2 will be described. In the imaging device 2, as a circuit substrate of the imaging panel 50, the circuit substrate 10 of the first embodiment is used. Thus, disconnection of the electrode 15 caused by a stepped cut is less likely to occur in the contact hole 16. As a result, for example, even when the imaging panel 50 is formed to be an even higher definition imaging panel by forming the contact hole 16 with a further reduced width, a high yield can be achieved.

4. Application Examples

Figure 21:
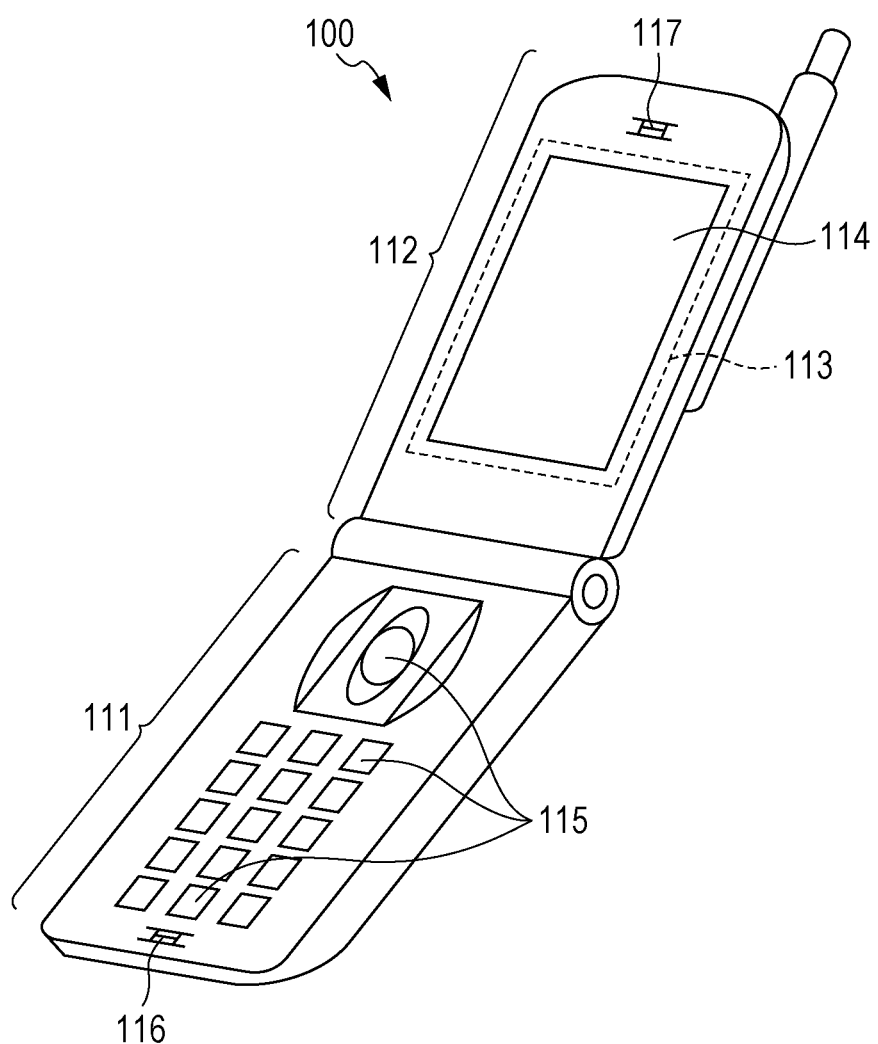
FIG. 21 is a perspective view showing an outer appearance of an electronic device according to an application example of the display device.

Next, an application example of the display device 1 of the second embodiment will be described. FIG. 21 is a perspective view schematically showing an example configuration of an electronic device 100 according to this application example. The electronic device 100 is a mobile telephone and, as shown in FIG. 21, includes, for example, a body portion 111 and a display portion 112 provided to be openable and closable relative to the body portion 111. The body portion 111 includes operation buttons 115 and a mouthpiece portion 116. The display portion 112 includes a display device 113 and an earpiece portion 117. The display device 113 is configured to display various displays for telephone communication on a display screen 114. The electronic device 100 includes a control unit (not shown) that controls the operation of the display device 113. The control unit is provided as a part of a control unit that controls the entire electronic device 100 or as a separate control unit therefrom in the body portion 111 or the display portion 112.

The display device 113 has the same configuration as that of the display device 1 of the second embodiment. Thus, for example, as the display device 113, a high definition display device can be mounted in the display portion 112 at a low cost.

Note that examples of an electronic device to which the display device 1 of the second embodiment is applicable include, in addition to the mobile telephone described above, a personal computer, a liquid crystal television set, a viewfinder-type or monitor-direct-view-type video tape recorder, a car navigation system, a pager, an electronic organizer, an electronic calculator, a word processor, a work station, a video telephone system, and a POS terminal, etc.

Furthermore, for example, the present application can adopt the following configurations.

(1) A circuit substrate including a plurality of devices, a plurality of conductive layers connected in one-to-one correspondence with the devices, and an insulating layer provided between the devices and the conductive layers, the devices, the conductive layers, and the insulating layer being provided on an insulating substrate, wherein the insulating layer includes a first insulating layer covering the devices, a second insulating layer formed on the first insulating layer, and a plurality of contact holes each passing through the first insulating layer and the second insulating layer in a thickness direction thereof, wherein a side surface of the first insulating layer and a side surface of the second insulating layer contact each other in at least part of the inside of each of the contact holes, and wherein the conductive layers are formed so that each of the conductive layers extends along an upper surface of the second insulating layer, at least a part of a side surface of a corresponding one of the contact holes in which the side surface of the first insulating layer and the side surface of the second insulating layer contact each other, and a bottom surface of the contact hole.

(2) The circuit substrate according to (1), wherein the side surface of the first insulating layer and the side surface of the second insulating layer contact each other in a loop shape.

(3) The circuit substrate according to (1), wherein each of the side surface of the first insulating layer and the side surface of the second insulating layer has a loop shape having a longitudinal direction and a lateral direction when viewed from a direction normal to the insulating substrate, and wherein a part of the side surface of the first insulating layer extending in the longitudinal direction and a part of the side surface of the second insulating layer extending in the longitudinal direction contact each other.

(4) The circuit substrate according to any one of (1) to (3), wherein the conductive layers are formed so that each of the conductive layers extends along the entirety of the side surface and the entirety of the bottom surface of a corresponding one of the contact holes.

(5) The circuit substrate according to any one of (1) to (4), wherein the devices are thin film transistors (TFTs), and wherein the conductive layers are pixel electrodes.

(6) The circuit substrate according to (5), wherein the contact holes are formed so that each of the contact holes is located immediately over a source electrode or a drain electrode of a corresponding one of the TFTs, and wherein the conductive layer contacts the source electrode or the drain electrode.

(7) The circuit substrate according to any one of (1) to (6), wherein the first insulating layer is made of an inorganic material, and wherein the second insulating layer is made of a resin material.

(8) The circuit substrate according to (1),
wherein a part in which the side surface of the first insulating layer and the side surface of the second insulating layer contact each other is formed by etching the second insulating layer simultaneously with the first insulating layer in a manufacturing process of forming an opening corresponding to a lower portion of each of the contact holes in the first insulating layer.

(9) An electrooptical device including:
an electrooptical panel including a circuit substrate,
wherein the circuit substrate includes a plurality of devices, a plurality of conductive layers connected in one-to-one correspondence with the devices, and an insulating layer provided between the devices and the conductive layers, the devices, the conductive layers, and the insulating layer being provided on an insulating substrate,
wherein the insulating layer includes a first insulating layer covering the devices, a second insulating layer formed on the first insulating layer, and a plurality of contact holes each passing through the first insulating layer and the second insulating layer in a thickness direction thereof,
wherein a side surface of the first insulating layer and a side surface of the second insulating layer contact each other in at least part of the inside of each of the contact holes, and
wherein the conductive layers are formed so that each of the conductive layers extends along an upper surface of the second insulating layer, at least a part of a side surface of a corresponding one of the contact holes in which the side surface of the first insulating layer and the side surface of the second insulating layer contact each other, and a bottom surface of the contact hole.

(10) A method for manufacturing a circuit substrate, the method including
forming, after forming a plurality of devices on an insulating substrate, a first insulating layer covering the devices and a second insulating layer covering the first insulating layer,
forming, after forming a first opening passing through the second insulating layer, a resist layer having a second opening through which the entirety or part of a bottom surface of the first opening and part of a side surface of the first opening are exposed,
forming in the first insulating layer a third opening which contacts at least part of the side surface of the first opening and through which part of a corresponding one of the devices is exposed by selectively etching the first insulating layer and the second insulating layer using the resist layer as a mask, and then, removing the resist layer, and
forming conductive layers so that each of the conductive layers extends along an upper surface of the second insulating layer, a part in which the side surface of the first opening and a side surface of the third opening contact each other, and the part of the device exposed at a bottom surface of the third opening.

(11) The method according to (10),
wherein in the forming of a resist layer having a second opening, the second opening is formed so that the entirety of the bottom surface of the first opening and the entirety of a loop-shaped part of the side surface of the first opening which contacts the bottom surface of the first opening are exposed.

(12) The method according to (10),
wherein in the forming of a resist layer having a second opening, the second opening is formed so that only a part of the bottom surface of the first opening and a part of a loop-shaped part of the side surface of the first opening which contacts the bottom surface of the first opening are exposed.

(13) The method according to (12),
wherein in the forming of a resist layer having a second opening, the second opening is provided in the resist layer so that, by the etching performed in the forming of a third opening, each of the side surface of the first opening and the side surface of the third opening has a loop shape having a longitudinal direction and a lateral direction when viewed from a direction normal to the insulating substrate and a part of the side surface of the first opening extending in the longitudinal direction and a part of the side surface of the third opening extending in the longitudinal direction contact each other.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A circuit substrate comprising:
a plurality of devices having drain electrodes;
a plurality of conductive layers connected in one-to-one correspondence with the devices; and
an insulating layer provided between the devices and the conductive layers,
the devices, the conductive layers, and the insulating layer being provided on an insulating substrate,
wherein the insulating layer includes a first insulating layer covering the devices, a second insulating layer formed on the first insulating layer, and a plurality of contact holes each passing through the first insulating layer and the second insulating layer in a thickness direction thereof,
wherein inside each one of the plurality of contact holes a first side surface of the first insulating layer forming a first part of a side surface of said one of the plurality of contact holes and a second side surface of the second insulating layer forming a second part of the side surface of said one of the plurality of contact holes contact each other inside said one of the plurality of contact holes,
wherein the conductive layers are formed so that each of the conductive layers extends along an upper surface of the second insulating layer, at least part of the side surface of said one of the plurality of contact holes at which the first side surface and the second side surface contact each other, and a bottom surface of the contact hole,
wherein each of the first side surface and the second side surface has a loop shape having a longitudinal direction and a lateral direction when viewed from a direction normal to the insulating substrate,
wherein a part of the first side surface extending in the longitudinal direction and a part of the second side surface extending in a longitudinal direction contact each other,
wherein an inclination angle of the first side surface is more gentle in the longitudinal direction than in the lateral direction,
wherein the first insulating layer is arranged on the drain electrode, and
wherein one of the conductive layers is arranged on the drain electrode and is sandwiched between portions of the first layer, and wherein a width of said one of the conductive layers is greater in the longitudinal direction than in the lateral direction.

2. The circuit substrate according to claim 1,
wherein the first side surface and the second side surface contact each other in a loop shape.

3. The circuit substrate according to claim 1,
wherein the conductive layers are formed so that each of the conductive layers extends along the entirety of the side surface and the entirety of the bottom surface of a corresponding one of the contact holes.

4. The circuit substrate according to claim 1,
wherein the devices are thin film transistors (TFTs), and
wherein the conductive layers are pixel electrodes.

5. The circuit substrate according to claim 4,
wherein the contact holes are formed so that each of the contact holes is located immediately over a source electrode or a drain electrode of a corresponding one of the TFTs, and
wherein the conductive layer contacts the source electrode or the drain electrode.

6. The circuit substrate according to claim 1,
wherein the first insulating layer is made of an inorganic material, and
wherein the second insulating layer is made of a resin material.

7. The circuit substrate according to claim 1,
wherein a part in which the first and second side surfaces contact each other is formed by etching the second insulating layer simultaneously with the first insulating layer in a manufacturing process of forming an opening corresponding to a lower portion of each of the contact holes in the first insulating layer.

8. An electrooptical device comprising:
an electrooptical panel including a circuit substrate,
wherein the circuit substrate includes a plurality of devices comprising drain electrodes, a plurality of conductive layers connected in one-to-one correspondence with the devices, and an insulating layer provided between the devices and the conductive layers, the devices, the conductive layers, and the insulating layer being provided on an insulating substrate,
wherein the insulating layer includes a first insulating layer covering the devices, a second insulating layer formed on the first insulating layer, and a plurality of contact holes each passing through the first insulating layer and the second insulating layer in a thickness direction thereof,
wherein inside each one of the plurality of contact holes a first side surface of the first insulating layer forming a first part of a side surface of said one of the plurality of contact holes and a second side surface of the second insulating layer forming a second part of the side surface of said one of the plurality of contact holes contact each other inside said one of the plurality of contact holes,
wherein the conductive layers are formed so that each of the conductive layers extends along an upper surface of the second insulating layer, at least part of the side surface of said one of the plurality of contact holes at which the first side surface and the second side surface contact each other, and a bottom surface of the contact hole,
wherein each of the first side surface and the second side surface has a loop shape having a longitudinal direction and a lateral direction when viewed from a direction normal to the insulating substrate,
wherein a part of the first side surface extending in the longitudinal direction and a part of the second side surface extending in a longitudinal direction contact each other,
wherein an inclination angle of the first side surface is more gentle in the longitudinal direction than in the lateral direction,
wherein the first insulating layer is arranged on the drain electrode, and
wherein one of the conductive layers is arranged on the drain electrode and is sandwiched between portions of the first layer, and wherein a width of said one of the conductive layers is greater in the longitudinal direction than in the lateral direction.

* * * * *